(12) United States Patent
Lindblom et al.

(10) Patent No.: US 9,209,766 B1
(45) Date of Patent: Dec. 8, 2015

(54) HIGH TEMPERATURE CHARGE AMPLIFIER FOR GEOTHERMAL APPLICATIONS

(71) Applicant: Sandia Corporation, Albuquerque, NM (US)

(72) Inventors: Scott C. Lindblom, Sandia Park, NM (US); Frank J. Maldonado, Albuquerque, NM (US); Joseph A. Henfling, Bosque Farms, NM (US)

(73) Assignee: Sandia Corporation, Albuquerque, NM (US)

( * ) Notice: Subject to any disclaimer, the term of this patent is extended or adjusted under 35 U.S.C. 154(b) by 163 days.

(21) Appl. No.: 14/023,209

(22) Filed: Sep. 10, 2013

Related U.S. Application Data

(60) Provisional application No. 61/699,431, filed on Sep. 11, 2012.

(51) Int. Cl.
*H03F 13/00* (2006.01)
*H03F 3/45* (2006.01)

(52) U.S. Cl.
CPC ............ *H03F 3/45475* (2013.01); *H03F 13/00* (2013.01)

(58) Field of Classification Search
CPC .................. H03F 13/00; G01D 3/036

USPC .............. 330/9.69, 174, 301; 73/504.16
See application file for complete search history.

(56) References Cited

U.S. PATENT DOCUMENTS

| | | | |
|---|---|---|---|
| 5,010,302 | A | 4/1991 | Krempl et al. |
| 5,678,057 | A | 10/1997 | Rostoker et al. |
| 6,879,491 | B2 | 4/2005 | Jauregui |
| 7,301,223 | B2 | 11/2007 | Rodney et al. |

*Primary Examiner* — Khanh V Nguyen
*Assistant Examiner* — Khiem Nguyen
(74) *Attorney, Agent, or Firm* — Daniel J. Jenkins

(57) ABSTRACT

An amplifier circuit in a multi-chip module includes a charge to voltage converter circuit, a voltage amplifier a low pass filter and a voltage to current converter. The charge to voltage converter receives a signal representing an electrical charge and generates a voltage signal proportional to the input signal. The voltage amplifier receives the voltage signal from the charge to voltage converter, then amplifies the voltage signal by the gain factor to output an amplified voltage signal. The lowpass filter passes low frequency components of the amplified voltage signal and attenuates frequency components greater than a cutoff frequency. The voltage to current converter receives the output signal of the lowpass filter and converts the output signal to a current output signal; wherein an amplifier circuit output is selectable between the output signal of the lowpass filter and the current output signal.

20 Claims, 4 Drawing Sheets

HIGH TEMPERATURE CHARGE AMPLIFIER FOR GEOTHERMAL APPLICATIONS

CROSS REFERENCE TO RELATED APPLICATION

This application claims the benefit of U.S. Provisional Patent Application Ser. No. 61/699,431, filed Sep. 11, 2012, and entitled "HIGH TEMPERATURE CHARGE AMPLIFIER FOR GEOTHERMAL APPLICATIONS", the entirety of which is incorporated herein by reference.

STATEMENT REGARDING FEDERALLY SPONSORED RESEARCH OR DEVELOPMENT

This invention was developed under Contract DE-AC94AL-85000 between Sandia Corporation and the U.S. Department of Energy. The U.S. Government has certain rights in this invention.

BACKGROUND

The application generally relates to charge amplifier circuits. The application relates more specifically to a charge amplifier circuit for high temperature downhole applications, e.g., geothermal and oil and gas exploration.

High temperature microseismic tools may be used for the characterization and development of enhanced geothermal systems (EGS). Accelerometers may be used to measure shock and vibration phenomena over a broad temperature range in geothermal applications. Charge mode accelerometers operate by generating a charge output in response to forces created by input vibration or shock acting upon a seismic system. Because of the high impedance level of the charge mode signal generated by piezoceramic crystals in the accelerometer, a special type of amplifier called a charge amplifier is used to condition the very high impedance electrostatic charge signal. The charge amplifier converts the charge to a low impedance voltage mode signal without modifying the charge signal.

Typically diagnostic tools such accelerometers and charge amplifiers are employed in harsh environments such as drill holes at depths of 3,000 meters or more where temperatures may be extremely high. Microseismic tools may provide real-time data from the downhole environment to improve the drilling process and allow quicker detection of problems for more efficient drilling.

Existing charge amplifiers are comprised of components that can withstand only a limited range of temperatures, e.g., up to about 225° C., which are unsuitable for extended exposure to deep bore hole conditions. Heat shields may be used to enclose the charge amplifiers to increase the application temperatures. However, heat shielded amplifiers cannot remain in a deep bore hole for extended periods of time.

Further, charge amplifiers designed for accelerometer interfaces may be limited to the specific impedance properties of the accelerometer. Such amplifiers are unsuited for use as general instrumentation amplifiers other than accelerometers, requiring the user to design a separate amplifier for general instrumentation.

Intended advantages of the disclosed systems and/or methods satisfy one or more of these needs or provide other advantageous features. Other features and advantages will be made apparent from the present specification. The teachings disclosed extend to those embodiments that fall within the scope of the claims, regardless of whether they accomplish one or more of the aforementioned needs.

SUMMARY

One embodiment relates to an amplifier circuit. The amplifier circuit includes a charge to voltage converter circuit, a voltage amplifier a low pass filter and a voltage to current converter. The charge to voltage converter receives a signal representing an electrical charge and generates a voltage signal proportional to the input signal. The voltage amplifier is in communication with the charge to voltage converter, and receives the voltage signal from the charge to voltage converter, then amplifies the voltage signal by the gain factor to output an amplified voltage signal. The lowpass filter passes low frequency components of the amplified voltage signal and attenuates frequency components greater than a cutoff frequency. The voltage to current converter receives the output signal of the lowpass filter and converts the output signal to a current output signal; wherein an amplifier circuit output is selectable between the output signal of the lowpass filter and the current output signal.

Another embodiment relates to a multi-chip module. The multi-chip module includes a high temperature charge amplifier and instrumentation amplifier circuit formed on a substrate. The amplifier circuit includes a charge to voltage converter chip; a voltage amplifier chip; a low pass filter chip; and a voltage to current converter chip. The charge to voltage converter chip receives an input signal and generates a voltage signal proportional to the input signal. The voltage amplifier chip in communication with the charge to voltage converter receives the voltage signal from the charge to voltage converter, and amplifies the voltage signal by a gain factor. The lowpass filter chip receives the amplified voltage signal, passes through low frequency components of the amplified voltage signal and attenuates frequency components of the amplified voltage signal greater than a cutoff frequency of the lowpass filter. The voltage to current converter chip receives the filtered voltage output signal of the lowpass filter and converts the filtered output voltage signal to a current output signal.

Another embodiment relates to an amplifier circuit. The amplifier circuit includes a charge to voltage converter, a voltage amplifier and a low pass filter. The charge to voltage converter includes a first pair of resistors with a first resistance connected at an input port and a second pair of resistors with a second resistance connected in parallel with an operational amplifier circuit of the converter. The charge to voltage converter receives an input voltage and amplifies the input voltage by a gain ratio proportional to a ratio of the first resistance value to the second resistance value. The voltage amplifier receives the voltage signal from the charge to voltage converter and amplifies the voltage by the voltage amplifier gain factor. The lowpass filter passes low frequency components of the voltage signal and attenuates frequency components greater than a cutoff frequency.

An advantage is that the charge amplifier described below increases the operable temperature range above existing 225° C. seismic tool charge amplifiers by increasing the operating temperature up to 275° C., increasing amplifier sensitivity, and decreasing the size and power consumption of the amplifier.

Another advantage is the charge amplifier circuit can provide a voltage output as required for use with high temperature digital electronics, or a current output for driving well-logging cables directly.

Still another advantage is a multi-functional seismic monitoring tool is provided in a high temperature charge amplifier, wherein external resistors can be used to convert the high temperature charge amplifier circuit to an instrumentation amplifier, thus expanding the utility of the charge amplifier circuit for downhole sensing applications.

Alternative exemplary embodiments relate to other features and combinations of features as may be generally recited in the claims.

DETAILED DESCRIPTION OF THE EXEMPLARY EMBODIMENTS

A high temperature charge amplifier circuit as described below is designed for interfacing with high temperature accelerometers used in monitoring seismic activity associated with geothermal exploration. The charge amplifier circuit may be fabricated in a multichip module (MCM) microcircuit to increase its temperature rating and reliability. The charge amplifier circuit can provide a voltage output for working with high temperature digital electronics, or a current output for driving well-logging cables directly. Utilizing current output, a multi-functional seismic monitoring tool is provided in a high temperature charge amplifier. In addition, by adding external resistors the high temperature charge amplifier circuit may also be used as an instrumentation amplifier.

Figure 1:
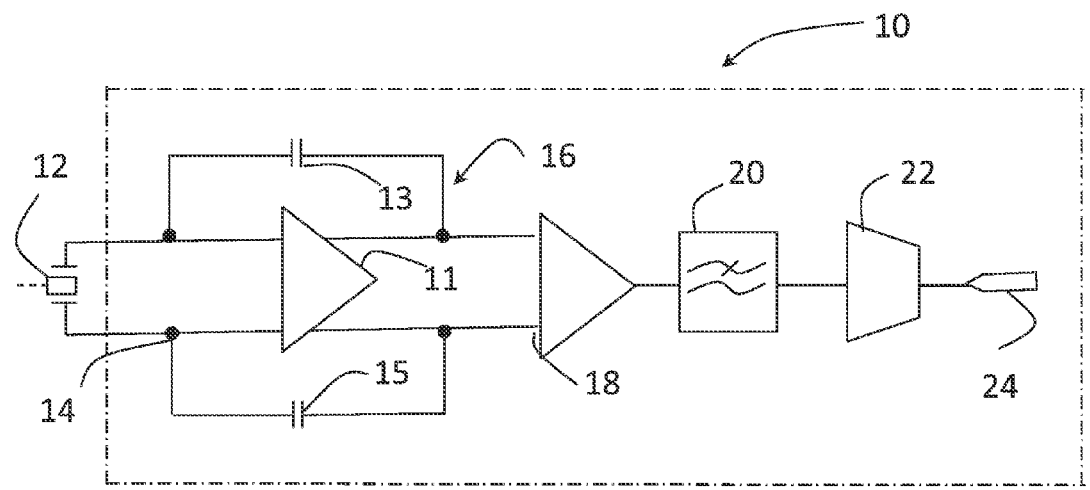
FIG. 1 is a block diagram of a charge amplifier circuit.

Referring to FIG. 1, a block diagram for a charge amplifier circuit 10 is shown. An accelerometer 12 is connected at an input port 14 of charge amplifier circuit 10. Accelerometer 12 may be, e.g., a piezoceramic transducer for sensing low frequency and low acceleration vibration. In one embodiment accelerometer 12 may have a charge to acceleration (Q/a) ratio of 1000 picocoulombs per unit of gravitational acceleration (pC/g). Input port 14 is in electronic communication with a charge-to-voltage converter 16. The input signal or charge at input port 14 from accelerometer 12 is converted to a (DC) voltage signal v at the output of charge-to-voltage converter 16. In one embodiment charge-to-voltage converter 16 may be a fully differential charge-to-voltage converter having a response characteristic of $10^9$ volts per coulomb (V/C). Charge-to-voltage converter 16 includes a pair of shunt capacitors 13, 15 connected between input and output terminals, respectively. Shunt capacitors 13, 15 are connected in parallel with an operational amplifier 11.

Charge-to-voltage converter 16 is connected at its output to a voltage amplifier 18. Following the charge-to-voltage conversion, voltage signal v is amplified by amplifier 18, e.g., by a factor of 10. The amplified signal at the output of amplifier 18 is then filtered by low pass filter 20 connected at the output of voltage amplifier 18. Low pass filter 20 filters the amplified voltage signal to remove undesirable high frequency components of the amplified voltage signal. In one embodiment low pass filter 20 may operate at a gain of one (A=1) and have a cut-off frequency ($f_c$) of 2.9 kHz.

The filtered signal at the output of low pass filter 20 may be taken as the output of charge-to-voltage circuit 10 at output terminal 24. Alternately, through a jumper setting (not shown), the filtered signal may be selectively input to a voltage-to-current (V-I) converter 22 and converted to a current signal at the output terminal 24. V-I converter 22 may have a current-to-voltage ratio set by an external resistor to accommodate the drive requirements, e.g., for application specific logging cables. In an exemplary embodiment, V-I converter 22 may have a current-to-voltage ratio of 8 milliamperes per volt (8 mA/V), with current output equal to 80 mA/g assuming voltage gain of op amp 18 equal to 10.

The voltage output mode may be used, e.g., when a downhole analog-to-digital converter is present in a system to digitize the signal and transmit the data. The current output mode may be used, e.g., to drive a well-logging cable directly, thus eliminating the need to provide more expensive digital electronics downhole.

Figure 2:
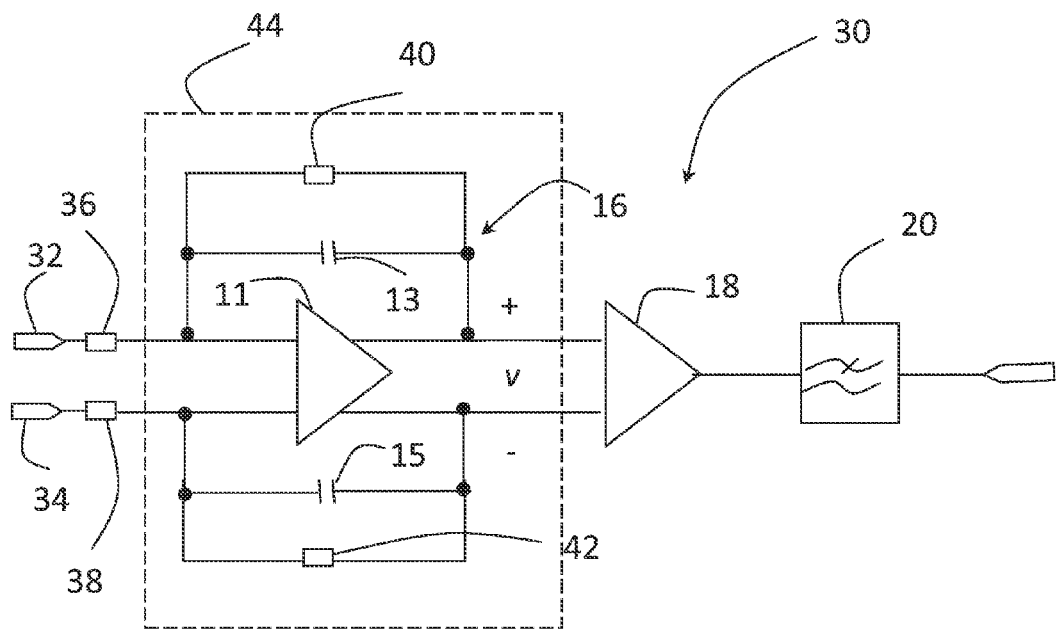
FIG. 2 is a schematic diagram of a multi-chip module (MCM) high temperature charge amplifier circuit.
Figure 7:
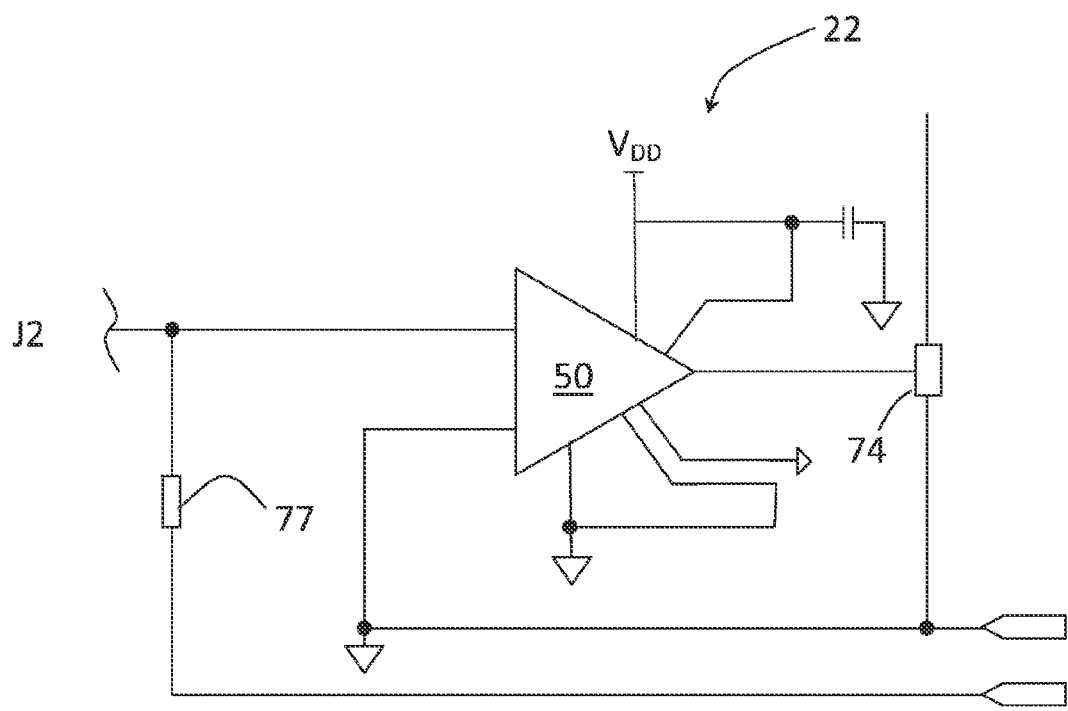
FIG. 7 is a voltage-to-converter circuit of the multi-chip module.
Figure 3:
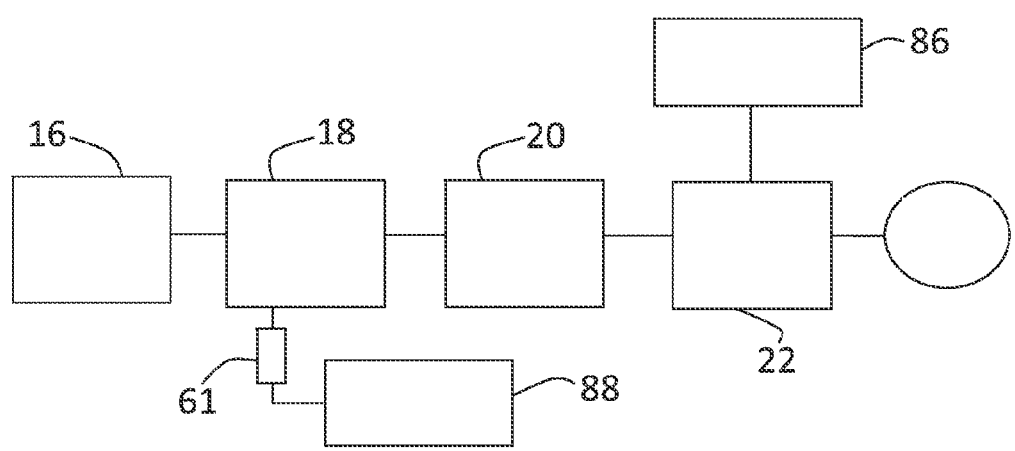
FIG. 3 is a schematic diagram of a multi-chip module circuit for a combination charge-to-voltage amplifier/differential amplifier.
Figure 4:
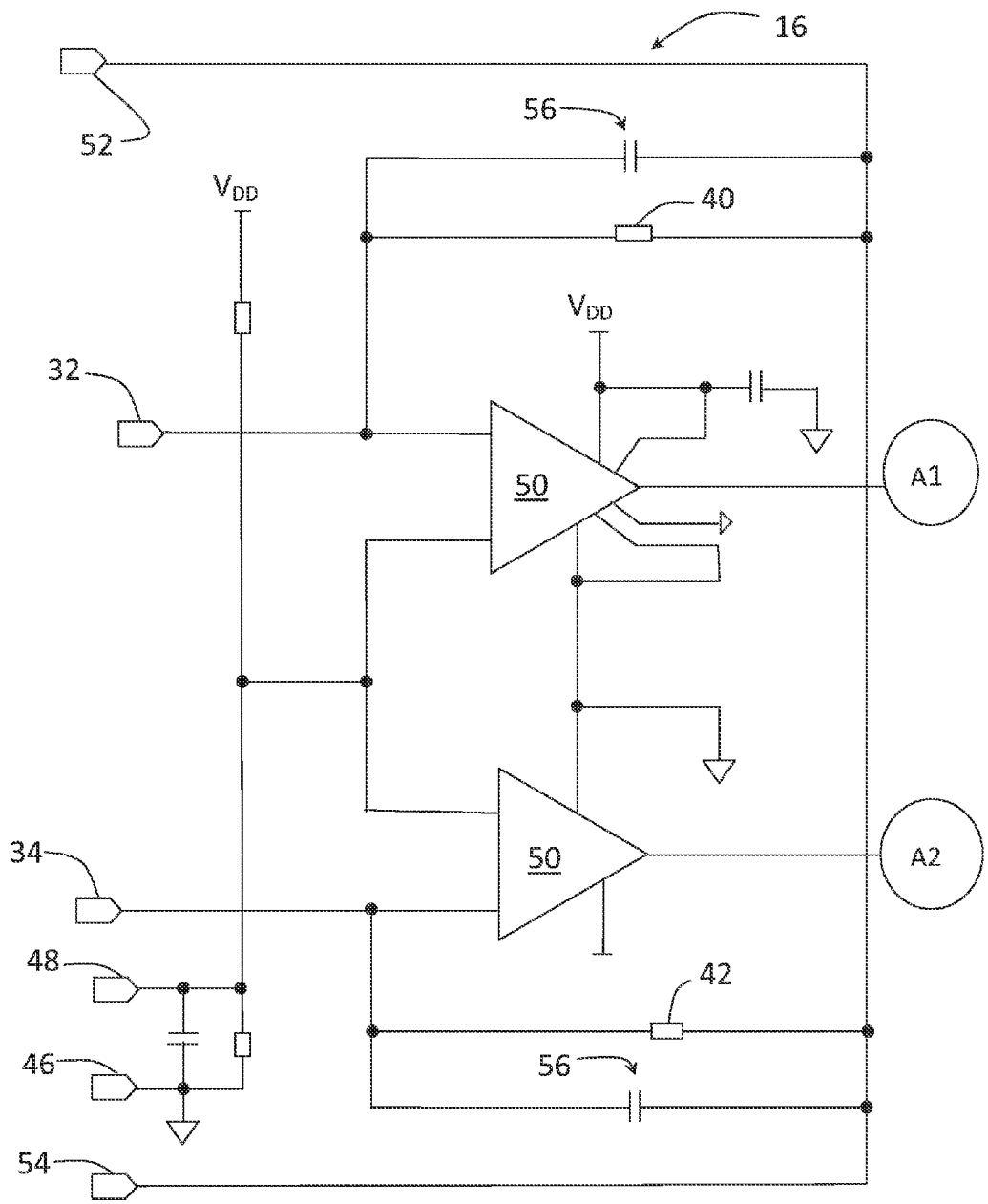
FIG. 4 is a charge-to-voltage/differential amplifier circuit of the multi-chip module.
Figure 5:
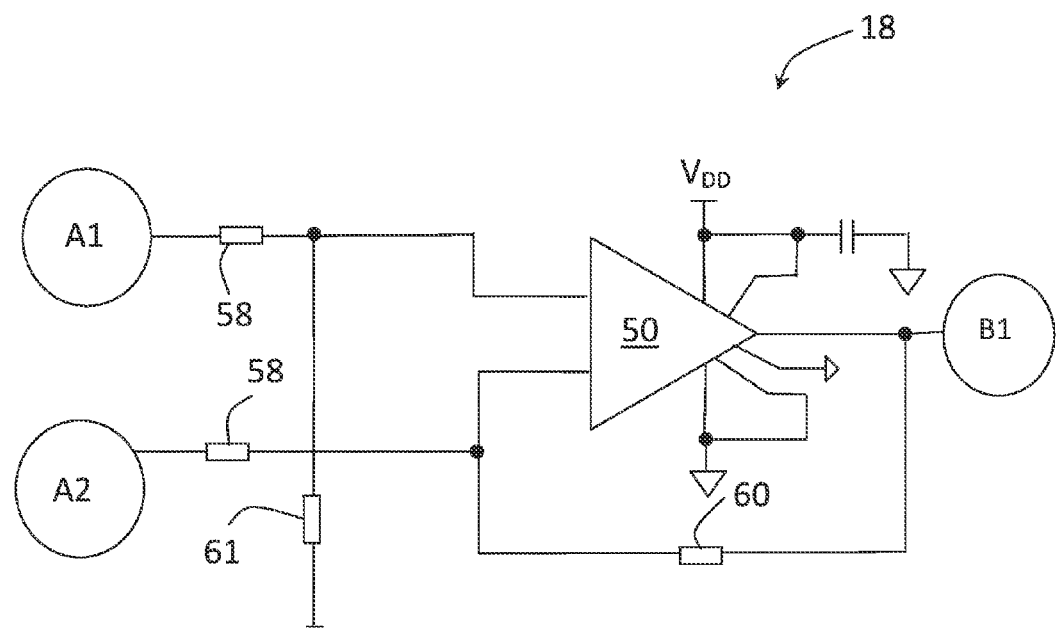
FIG. 5 is a voltage amplifier of the multi-chip module
Figure 6:
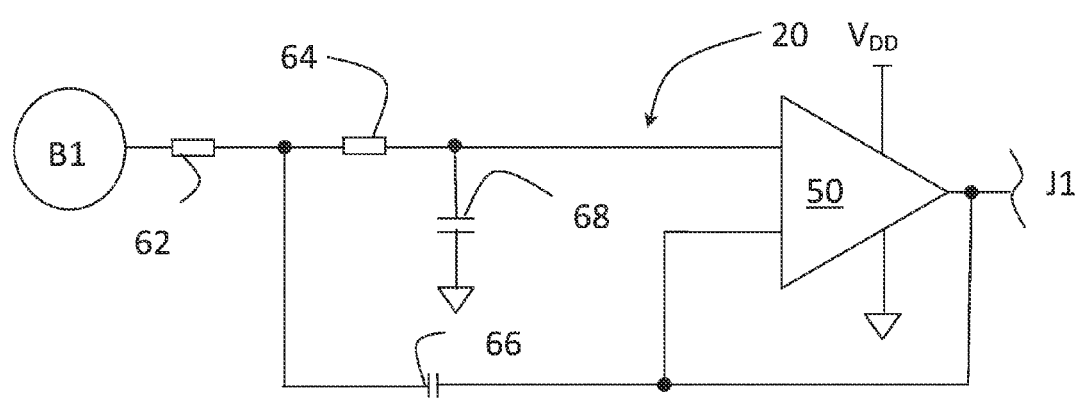
FIG. 6 is a low pass filter circuit of the multi-chip module

Referring next to FIG. 2, in an alternate embodiment, charge amplifier circuit 10 may be modified to add external resistors 36, 38, 40, 42 to convert the charge amplifier circuit to an instrumentation amplifier 30. The use of external resistors expands the utility of amplifier 10 to include, e.g., other downhole sensing applications. Instrumentation amplifier may also be used, e.g., to condition signals from pressure sensors, temperature sensors, or geophones. In an embodiment external resistors 36, 38, 40, 42 may be integrated, e.g., an MCM (FIG. 3) and then configured externally as jumpers. External resistors provide a differential amplifier characterized by very high input impedance. Instrumentation amplifier 30 includes a pair of series resistors 36, 38 having a first resistance value (R1) at input terminals 32, 34 (Vin$^+$ and Vin$^-$), respectively, and a pair of shunt resistors 40, 42 having a second resistance value (R2). Resistors 36, 38 are connected in series with charge-to-voltage converter 16. It should be understood that when in instrumentation amplifier mode, charge-to-voltage converter 16 circuit no longer functions as a charge-to-voltage converter, but functions more specifically as a differential input stage. Resistors 40, 42 are connected in parallel with shunt capacitors 13, 15, respectively. In one embodiment series resistors 36, 38 may have a resistance R1 and shunt resistors 40, 42 may have a resistance R2. The addition of series input resistors 36, 38 and capacitor shunt resistors 40, 42, to charge-to-voltage converter 16 creates a differential amplifier 44, having a gain equal to twice the ratio of R2 divided by R1 as shown in equation 1 below:

$$A = 2 \times (R2/R1) \qquad \text{Equation 1}$$

The amplified voltage signal v is input to amplifier 18 and amplified, e.g., by a factor of 10 (A=10). The values for gain and filter cutoff may be hardwired in the MCM (FIG. 3) or alternately, values for gain and filter cutoff may be modified to provide a gain ranging from 10 to 100 and a filter cutoff between 100 Hz and 4 kHz. Such gain and cutoff frequency are appropriate ranges, e.g., a microseismic application or measuring a low frequency signal such as temperature or pressure downhole. The amplified signal at the output of amplifier 18 is then filtered by low pass filter 20 connected at the output of voltage amplifier 18. Low pass filter 20 filters the amplified voltage signal to remove undesirable high frequency components of the amplified voltage signal. In one embodiment low pass filter 20 may operate at a gain of one (A=1) and have a cut-off frequency ($f_c$) of 2.9 kHz. The output signal of filter 20 in the differential amplifier configuration of FIG. 2 is represented by equation 2 below:

$$V_{out} = 10 \times V_{in} \qquad \text{Equation 2}$$

Referring next to FIGS. 3-7, in an exemplary embodiment a multi-chip module (MCM) 100 may be fabricated to implement the high temperature charge amplifier 10 or instrumentation amplifier 30 described above with respect to FIGS. 1 and 2. By integrating high temperature components into MCM 100 the high temperature charge amplifier 10 and instrumentation amplifier 30 may be deployed in environments such as drill holes at temperatures up to 275° C. for extended periods of time without special heat shields.

MCM 100 packages multiple circuits or chip components on a substrate, including charge-to-voltage converter 16, voltage amplifier 18, low-pass filter 20 and V-I converter 22. Each of the circuits 16, 18, 20, and 22 may be a separate chip implemented on the MCM package.

Charge-to-voltage converter 16 includes a pair of high temperature rated operational amplifiers 50 connected in parallel. In one embodiment each operational amplifier may be, e.g., a high temperature dual precision operational amplifier model HTOP01 manufactured by Honeywell International Inc., of Plymouth, Minn. The operational amplifier is a precision low power operational amplifier having low input offset voltage and drift over an operating temperature range of −55° C. to 225° C. Input offset voltage may be continuously sampled and compensated, providing offset voltage compensation over temperature and time. Charge-to-voltage converter 16 includes voltage input terminals 32, 34, in addition to ground terminal 46, voltage offset terminal 48, and a pair of external resistor terminals 52, 54 for connecting optional series resistors 36, 38 for instrumentation amplifier 30. Charge-to-voltage converter 16 also includes a pair of R-C circuits 56 connected in parallel with each operational amplifier 50. In one embodiment RC circuit 56 includes a resistor and a 2000 pF capacitor connected in parallel, the resistor providing the resistance value for R2 in the differential amplifier 44 of FIG. 2. In one embodiment, the RC circuit resistance may be 1 MΩ or 2 MΩ, or greater to provide greater low end frequency response. In the charge amplifier mode RC resistor determines the low frequency cutoff as described in the comment above. In the instrumentation amplifier mode R2 is represented by external resistors 40 and 42 (FIG. 2). Since resistors 40 and 42 are small compared with the 1 MΩ or 2 MΩ, or greater resistor inside the MCM gain is approximated as indicated by Equation 1. In one embodiment, if resistors 40 and 42 are 10 kΩ then there will be a 1% gain error when factoring the parallel combination of 10 kΩ and 1 MΩ. Charge-to-voltage converter 16 further includes power supply pins, grounding pins, external clock and selector pins, and other components associated with operational amplifier 50.

At the output of charge-to-voltage converter 16 is voltage amplifier 18. Input resistors, e.g., 1 kΩ, are connected in series with operational amplifier 50 voltage input terminals. A feedback resistor 60 having a resistance value, e.g., 10 kΩ, is connected between voltage amplifier output and one of the operational amplifier 50 voltage input terminals. The value of resistor 60 establishes the gain of voltage amplifier 18. Resistor 60 and resistor 61 have the same resistance value to balance the amplifier circuit.

Low pass filter 20 receives the amplified voltage output of amplifier 18. Filter 20 includes a pair of resistors 62, 64 at the input in series with another operational amplifier 50, and a capacitor 66 connected between resistors 62, 64 and the operational amplifier 50. The output of filter 20 provides an output terminal 66 designated as $V_{out}$ of MCM 100. Another output terminal 68 of MCM is connected to the input of V-I converter 22. Terminals 66, 68 may be connected, e.g., by a jumper connector 72, to insert the optional V-I converter 22 into the amplifier circuit to provide a current output signal as described above. V-I converter 22 includes operational amplifier 50 that receives the voltage signal from filter 20 when a resistor 72, is inserted between terminals 66, 68. A high-temperature small-signal N-channel MOSFET is connected to the output of operational amplifier 50. MOSFET may be, e.g., a Model No. CHT-SNMOS-80 high voltage 80V N-channel small-signal MOSFET for high performance over a wide temperature range, e.g., a typical operation temperature range from −55° C. to 225° C., which is manufactured by CISSOID S. A. of Mont Saint Guibert—Belgium. Additional output terminals for MCM 100 are provided to provide a voltage input terminal 76, a voltage output terminal 78, an output terminal 82 and a power supply terminal 84. For V-I converter to function, external resistors must be added. A resistor 72 must be connected between 66 and 68, and another resistor 73 must be connected between 84 and 68, and R102 must be placed between 82 and 78. The relationship between the voltage at 66 and the current out of 78 is described as:

$$I_{out} = 1/R102((V_{in}R11)/R100 + (5VR11)/R101) \qquad \text{Equation 3}$$

Where:
R100=resistance value of resistor 72
R101=resistance value of resistor 73
R102=resistance value of resistor 74 and
R11=resistance value of resistor 77

The MOSFET, which has its gate-source voltage placed in a negative feedback around the op amp 50 (FIG. 7), is used to source $I_{out}$. A power supply and reset circuit 86, and circuit 88 for adjusting the output bias voltage are also provided on MCM 100.

It should be understood that the application is not limited to the details or methodology set forth in the following description or illustrated in the figures. It should also be understood that the phraseology and terminology employed herein is for the purpose of description only and should not be regarded as limiting.

It is important to note that the construction and arrangement of the high temperature charge amplifier as shown in the various exemplary embodiments is illustrative only. Although only a few embodiments have been described in detail in this disclosure, those who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

While the exemplary embodiments illustrated in the figures and described herein are presently preferred, it should be understood that these embodiments are offered by way of example only. Accordingly, the present application is not limited to a particular embodiment, but extends to various modifications that nevertheless fall within the scope of the appended claims. The order or sequence of any processes or method steps may be varied or re-sequenced according to alternative embodiments.

The invention claimed is:

1. An amplifier circuit comprising:
a charge-to-voltage converter;
a voltage amplifier; and
a low pass filter; and
a voltage to current converter;
the charge to voltage converter configured to receive an input signal representing an electrical charge from a transducer and generate a voltage signal proportional to the input signal;
the voltage amplifier having a gain factor in communication with the charge-to-voltage and configured to receive the voltage signal from the charge-to-voltage converter, and to amplify the voltage signal by the gain factor to output an amplified voltage signal;
the lowpass filter configured to pass low frequency components of the amplified voltage signal and attenuate frequency components of the amplified voltage signal greater than a cutoff frequency of the lowpass filter to create a filtered voltage output signal;
the voltage to current converter arranged to receive the filtered voltage output signal of the lowpass filter and convert the filtered output voltage signal to a current output signal;
wherein an amplifier circuit output is the voltage output signal or the current output signal.

2. The amplifier circuit of claim 1, wherein the charge to voltage converter comprises a pair of high temperature rated operational amplifiers connected in parallel.

3. The amplifier circuit of claim 2, wherein each high temperature rated operational amplifier comprises a high temperature operational amplifier having low input offset voltage and drift over an operating temperature range of −55° C. to 225° C.

4. The amplifier circuit of claim 1, wherein the charge-to-voltage converter comprises a fully differential charge-to-voltage converter.

5. The amplifier circuit of claim 4, wherein the fully differential charge-to-voltage converter comprises a response characteristic of $10^9$ volts per coulomb.

6. The amplifier circuit of claim 1, wherein the low pass filter further comprises a gain of one.

7. The amplifier circuit of claim 1, wherein the low pass filter further comprises a cut-off frequency of 2.9 kHz.

8. The amplifier circuit of claim 1, wherein the voltage to current converter further comprises an externally connected resistor configured to set a predetermined current-to-voltage ratio.

9. The amplifier circuit of claim 1, wherein the transducer is a piezoceramic accelerometer.

10. A multi-chip module comprising:
a high temperature charge amplifier and instrumentation amplifier circuit formed on a substrate, the amplifier circuit comprising:
a charge to voltage converter chip;
a voltage amplifier chip; and
a low pass filter chip; and
a voltage to current converter chip;
the charge to voltage converter chip configured to receive an input signal and generate a voltage signal proportional to the input signal;
the voltage amplifier chip in communication with the charge to voltage converter and configured to receive the voltage signal from the charge to voltage converter, and to amplify the voltage signal by a gain factor;
the lowpass filter chip configured to receive the amplified voltage signal, pass through low frequency components of the amplified voltage signal and attenuate frequency components of the amplified voltage signal greater than a cutoff frequency of the lowpass filter to create a filtered voltage output signal;
the voltage to current converter chip configured to receive the filtered voltage output signal of the lowpass filter and convert the filtered output voltage signal to a current output signal.

11. The multi-chip module of claim 10, wherein an amplifier circuit output is the voltage output signal or the current output signal.

12. The multi-chip module of claim 10, wherein the input signal is an electrical charge from an accelerometer.

13. The multi-chip module of claim 10, wherein the input signal is a voltage signal received from an instrument;
the charge to voltage converter chip connected to a first pair of external resistors having a first resistance value at an input port of the charge to voltage converter and a second pair of resistors having a second resistance value connected in parallel with an operational amplifier circuit of the charge to voltage converter; the charge to voltage converter configured to amplify the voltage signal by a predetermined gain ratio proportional to the first resistance value divided by the second resistance value.

14. The multi-chip module of claim 10, wherein the gain ratio is twice the ratio of the first resistance value divided by the second resistance value.

15. The multi-chip module of claim 10, wherein the charge to voltage converter comprises a pair of high temperature rated operational amplifiers connected in parallel.

16. The multi-chip module of claim 14, wherein each of the voltage amplifier chip and the voltage to current converter chip comprises a high temperature rated operational amplifier.

17. The multi-chip module of claim 15, wherein each high temperature operational amplifier having low input offset voltage and drift over an operating temperature range of −55° C. to 225° C.

18. The multi-chip module of claim 10, wherein the charge-to-voltage converter chip comprises a fully differential charge-to-voltage converter, wherein the fully differential charge-to-voltage converter chip comprises a response characteristic of $10^9$ volts per coulomb.

19. The multi-chip module of claim 10, wherein the voltage to current converter chip connected to an external resistor, the external resistor having a predetermined resistance configured to set a corresponding current-to-voltage ratio.

20. An amplifier circuit comprising:
a charge to voltage converter;
a voltage amplifier; and
a low pass filter;
the charge to voltage converter further comprising a first pair of resistors having a first resistance value connected at an input port of the charge to voltage converter and a second pair of resistors having a second resistance value connected in parallel with an input to an operational amplifier circuit of the charge to voltage converter;

the charge to voltage converter configured to receive an input voltage signal and amplify the input voltage signal by a predetermined gain ratio proportional to a ratio of the first resistance value divided by the second resistance value;

the voltage amplifier is in communication with the charge to voltage amplifier and configured to receive the voltage signal from the charge to voltage converter, and to amplify the voltage signal by a gain factor to output an amplified voltage signal;

the lowpass filter configured to pass low frequency components of the amplified voltage signal and attenuate frequency components of the amplified voltage signal greater than a cutoff frequency of the lowpass filter to create a filtered voltage output signal.

* * * * *